US008076741B2

(12) United States Patent
Lai et al.

(10) Patent No.: US 8,076,741 B2
(45) Date of Patent: Dec. 13, 2011

(54) PHOTO SENSING ELEMENT ARRAY SUBSTRATE

(75) Inventors: Chih-Ming Lai, Changhua County (TW); Yung-Hui Yeh, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 259 days.

(21) Appl. No.: 12/427,758

(22) Filed: Apr. 22, 2009

(65) Prior Publication Data

US 2010/0127254 A1    May 27, 2010

(30) Foreign Application Priority Data

Nov. 27, 2008   (TW) ................................ 97146038 A (51) Int. Cl.
*H01L 31/101* (2006.01)
*H01L 27/14* (2006.01)

(52) U.S. Cl. ............ 257/431; 257/43; 257/40; 257/222; 257/225; 257/257; 257/290; 257/E29.296; 257/E51.026; 257/E31.001; 257/E31.054; 257/E31.071; 257/E31.101; 257/E31.107

(58) Field of Classification Search ......... 2/43, E29.296, 2/40, 222, 25, 257, 290, 431, E21.026, E31.001, 2/E31.054, E31.071, E31.101, E31.107; 257/43, 257/E29.296, 40, 222, 25, 257, 290, 431, 257/E21.026, E31.001, E31.054, E31.071, 257/E31.101, E31.107

See application file for complete search history.

(56) References Cited

U.S. PATENT DOCUMENTS

| 6,953,978 B2* | 10/2005 | Chang et al. ................ 257/432 |
| 7,256,764 B2* | 8/2007 | Izumi ............................ 345/104 |
| 7,612,368 B2* | 11/2009 | Yu ................................... 257/40 |
| 2005/0285985 A1 | 12/2005 | Boer et al. | |

OTHER PUBLICATIONS

Nomura et al. (2004) "Room-Temperature Fabrication of Transparent Flexible Thin-Film Transistors Using Oxide Semiconductors," Nature 432:488-492.*

* cited by examiner

*Primary Examiner* — Ngan Ngo
*Assistant Examiner* — Benjamin Tzu-Hung Liu
(74) *Attorney, Agent, or Firm* — Jiang Chyun IP Office (57) ABSTRACT

A photo sensing element array substrate is provided. The photo sensing element array substrate includes a flexible substrate and a plurality of photo sensing elements. The photo sensing elements are disposed in array on the flexible substrate. Each of the photo sensing elements includes a photo sensing thin film transistor (TFT), an oxide semiconductor TFT and a capacitor. The photo sensing TFT is disposed on the flexible substrate. The oxide semiconductor TFT is disposed on the flexible substrate. The oxide semiconductor TFT is electrically connected to the photo sensing TFT. The capacitor is disposed on the flexible substrate and electrically connected between the photo sensing TFT and the oxide semiconductor TFT. When the photo sensing element array substrate is bent, it remains unaffected from normal operation.

32 Claims, 5 Drawing Sheets

PHOTO SENSING ELEMENT ARRAY SUBSTRATE

CROSS-REFERENCE TO RELATED APPLICATION

This application claims the priority benefit of Taiwan application serial no. 97146038, filed on Nov. 27, 2008. The entirety of the above-mentioned patent application is hereby incorporated by reference herein and made a part of specification.

BACKGROUND

1. Technical Field

The disclosure generally relates to a photo sensing element array substrate, and more particularly, to a flexible photo sensing element array substrate.

2. Description of Related Art

The semiconductor industry is one of those high-tech industries being most rapidly developed recently. As the electronic technologies being progressed every day, many high-tech electronic enterprises are born, and correspondingly, more human-friendly electronic products with improved performance are put into the market. Further, the applications of new materials and the improvement of the processing technologies are also critical factors for better satisfying the electronic products with the requirements of the market.

Among the variety of electronic products, flexible electronic products having advantages such as light weight, portability, and flexibility, are believed to have more potential for further development. For example, if a photo sensing element could be prepared in form of a flexible electronic product, it might be probably developed for the applications of an artificial retina, artificial skin of a robot, a flexible scanner, or a flexible copier. However, most of the conventional electronic products cannot endure being bent. When they are bent, the conventional electronic products are often incapable of normal operation, or even lost their functions. As such, the application of flexible electronic products is still restricted in limited fields.

Taking an ordinary thin film transistor (TFT) for example, the TFT has a semiconductor channel layer which is usually amorphous silicon or polysilicon. When the TFT is bent, the electrical characteristics of the TFT will be affected. For example, when the TFT is bent, the on-state current of the TFT will be to some degree different from the on-state current when the TFT is not bent. As such, when employed for fabricating a flexible electronic product, such a TFT may unfortunately cause the operation mode of the product unstable. Therefore, in order to more widely apply the techniques of flexible electronic products, a solution must be provided regarding the problem that when an electronic product is bent, it exhibits different characteristics.

SUMMARY

Accordingly, the disclosure is directed to provide a photo sensing element array substrate. The photo sensing element array substrate is flexible, and when the photo sensing element array substrate is bent, the photo sensing elements are unaffected from normal operation.

The disclosure provides a photo sensing element array substrate. The photo sensing element array substrate includes a flexible substrate, a plurality of photo sensing elements. The photo sensing elements are disposed in array on the flexible substrate. Each of the photo sensing elements includes a photo sensing thin film transistor (TFT), an oxide semiconductor TFT, and a capacitor. The photo sensing TFT is disposed on the flexible substrate. The oxide semiconductor TFT is disposed on the flexible substrate, and is electrically connected to the photo sensing TFT. The capacitor is disposed on the flexible substrate, and is electrically connected between the photo sensing TFT and the oxide semiconductor TFT.

The disclosure further provides a photo sensing element array substrate. The photo sensing element array substrate includes a flexible substrate, and a plurality of photo sensing elements. The photo sensing elements are disposed in array on the flexible substrate. The photo sensing elements include a photo sensing TFT, an oxide semiconductor TFT, and a capacitor. The photo sensing TFT is disposed on the flexible substrate. The oxide semiconductor TFT is disposed on the flexible substrate, and is electrically connected to the photo sensing TFT. The capacitor is disposed on the flexible substrate, and is electrically connected between the photo sensing TFT and the oxide semiconductor TFT. The photo sensing TFT includes a first gate, a photo sensitive semiconductor layer, a first dielectric layer, a first source, and a first drain. The first dielectric layer is disposed between the first gate and the photo sensitive semiconductor layer. The first source is connected to the photo sensitive semiconductor layer. The first drain is also connected to the photo sensitive semiconductor layer. The first source and the first drain are positioned at two opposite sides of the first gate. The oxide semiconductor TFT includes a second gate, an oxide semiconductor layer, a second dielectric layer, a second source, and a second drain. The oxide semiconductor layer is disposed on the first dielectric layer. The second source is connected to the oxide semiconductor layer. The second drain is connected to the oxide semiconductor layer. The second source and the second drain are positioned at two opposite sides of the oxide semiconductor layer. The second gate is disposed on the second dielectric layer, and is positioned above the oxide semiconductor layer.

According to the foregoing, the disclosure employs an oxide semiconductor TFT as a switching transistor of the photo sensing elements. As such, when the photo sensing element array substrate is bent, the oxide semiconductor TFT in an on-state is capable of maintaining a normal operation mode. Therefore, the photo sensing element array substrate is applicable for many kinds of flexible electronic products without bringing the problem of causing incapability of normal operation when the electronic product is bent.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Reference will now be made in detail to the present preferred embodiments of the disclosure, examples of which are illustrated in the accompanying drawings. Wherever possible, the same reference numbers are used in the drawings and the description to refer to the same or like parts.

Figure 1:
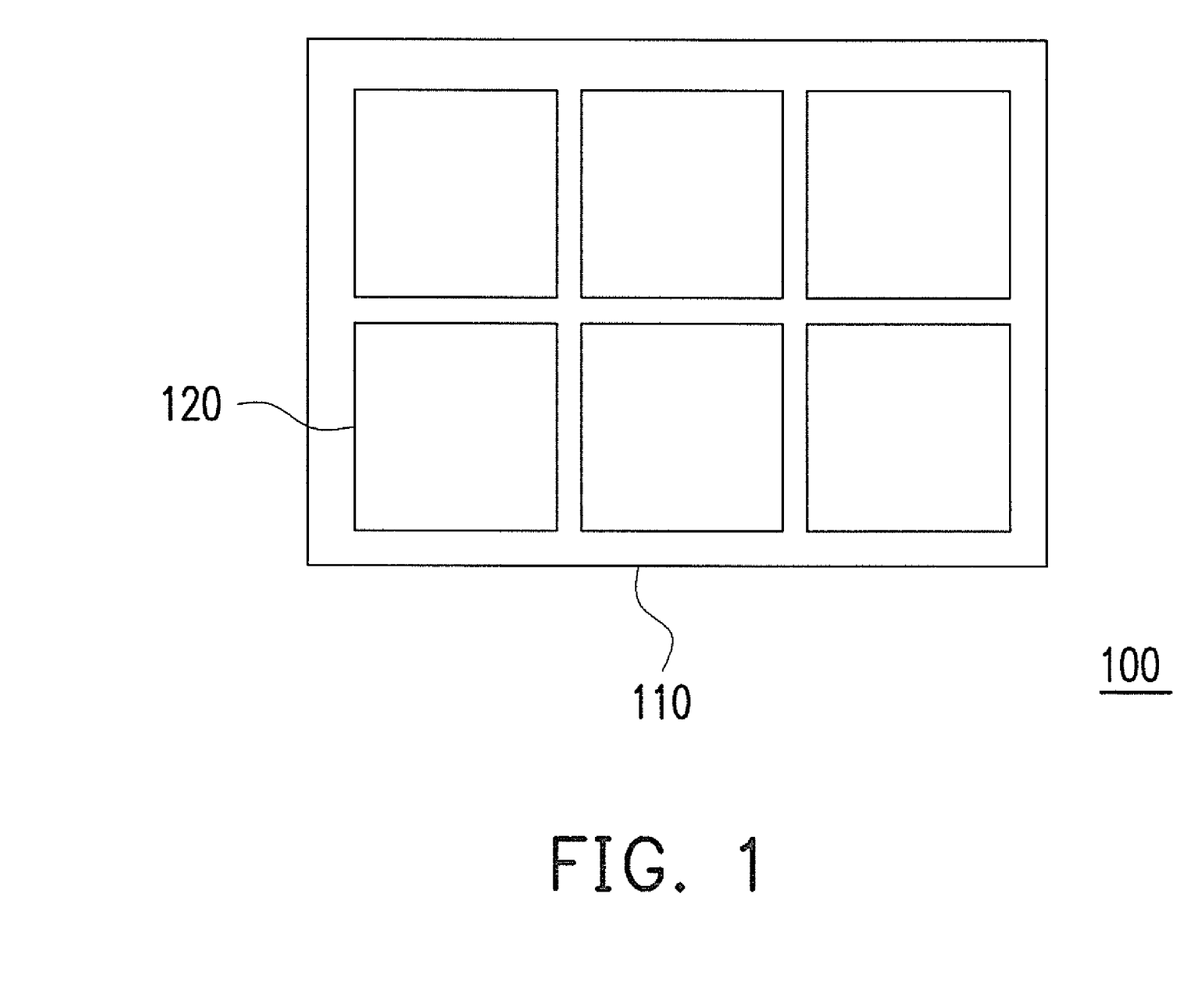
FIG. 1 is a schematic diagram illustrating a photo sensing element array substrate according to an embodiment of the disclosure.
Figure 2A:
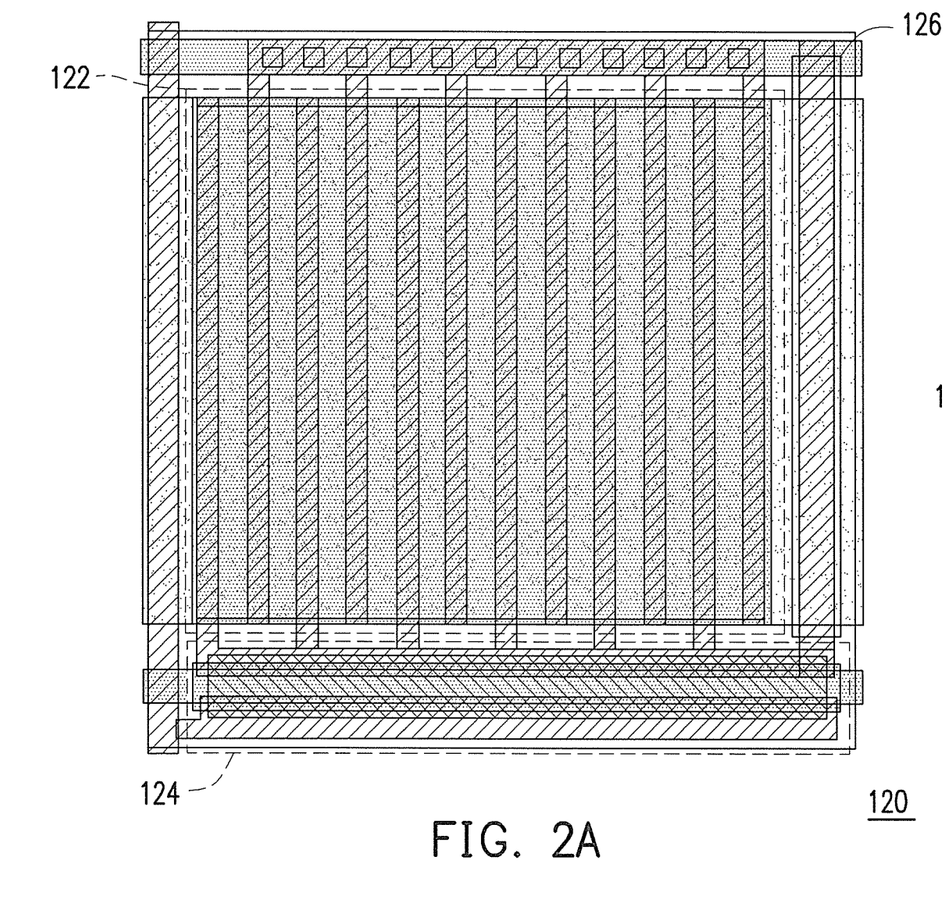
FIGS. 2A and 2B are a top view and a circuit diagram of a photo sensing element array substrate, respectively, according to an embodiment of the disclosure.
Figure 2B:
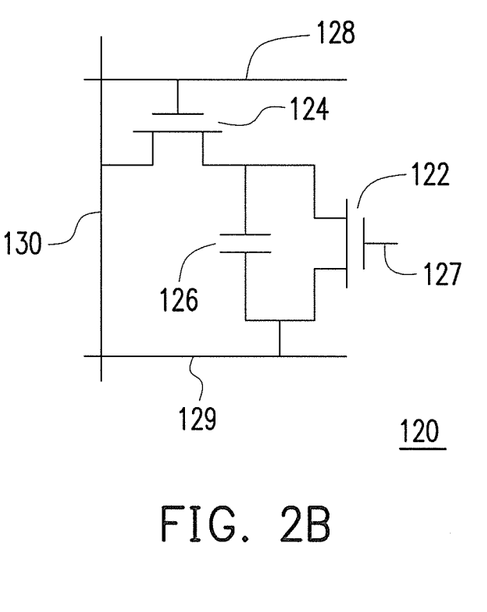

FIG. 1 is a schematic diagram illustrating a photo sensing element array substrate according to an embodiment of the disclosure. FIGS. 2A and 2B are a top view and a circuit diagram of a photo sensing element, respectively, according to an embodiment of the disclosure. Referring to FIGS. 1, 2A and 2B, a photo sensing element array substrate 100 includes a flexible substrate 110, and a plurality of photo sensing elements 120. Each of the photo sensing elements 120 includes a photo sensing thin film transistor (TFT) 122, an oxide semiconductor TFT 124, and a capacitor 126. The photo sensing TFT 122 is disposed on the flexible substrate 110. The oxide semiconductor TFT 124 is also disposed on the flexible substrate 110, and is electrically connected to the photo sensing TFT 122. The capacitor 126 is disposed on the flexible substrate 110, and is electrically connected between the photo sensing TFT 122 and the oxide semiconductor TFT 124.

Specifically, each of the photo sensing elements 120 is an element composed of two TFTs (i.e., 122 and 124) and a capacitor 126. In this case, the oxide semiconductor TFT 124 is in fact a switching element for controlling the photo sensing element 120 to be turned on or off. The photo sensing TFT 122 is in fact a sensing element executing the photo sensing function. More specifically, the photo sensing TFT 122 absorbs a light and then generates charges. The charges are stored in the capacitor 126. Then, a scan line 128 of the photo sensing element 120 transmits a voltage signal to turn on the oxide semiconductor TFT 124. When the oxide semiconductor TFT 124 turns on the photo sensing element 120, the charges stored in the capacitor 126 are then transmitted via the oxide semiconductor TFT 124 to a data line 130 of the photo sensing element 120. In such a way, the photo sensing element 120 is adapted for sensing the variation of light and generating corresponding signals, thus achieving the photo sensing function.

Further, as shown in FIG. 2B, the oxide semiconductor TFT 124 has a gate, a source, and a drain. The gate of the oxide semiconductor TFT 124 is coupled to the scan line 128. The source of the oxide semiconductor TFT 124 is coupled to the data line 130. The drain of the oxide semiconductor TFT 124 is coupled to the photo sensing TFT 122 and the capacitor 126. Further, in the practical circuit design, the photo sensing element 120 further includes power supply 127, and a common electrode 129. The common electrode 129 is in fact a ground wire of the photo sending element 120. One end of the capacitor 126 is coupled to the drain of the oxide semiconductor TFT 124, and another end of the capacitor 126 is coupled to the common electrode 129. The photo sensing TFT 122 has a gate, a source, and a drain. The gate of the photo sensing TFT 122 is coupled to the power supply 127. The power supply 127 provides a voltage dependent upon the type of the photo sensing TFT 122.

For example, when the photo sensing TFT 122 is a P-type TFT, the voltage provided by the power supply 127 is substantially a positive voltage, and when the photo sensing TFT 122 is an N-type TFT, the voltage provided by the power supply 127 is for example a negative voltage. Further, when the photo sensing TFT 122 is a P-type TFT, the source of the photo sensing TFT 122 is coupled to the drain of the oxide semiconductor TFT 124, while the drain of the photo sensing TFT 122 is coupled to the common electrode 129. When the photo sensing TFT 122 is an N-type TFT, the drain of the photo sensing TFT 122 is coupled to the drain of the oxide semiconductor TFT 124, while the source of the photo sensing TFT 122 is coupled to the common electrode 129.

In the current embodiment, the oxide semiconductor TFT 124 includes a semiconductor channel layer made of an oxide semiconductor material. Comparing with conventional TFTs which semiconductor channel layers are made of amorphous silicon or polysilicon materials, the oxide semiconductor TFT 124 is less sensitive to the bending degree of the flexible substrate 110. In other words, no matter whether the flexible substrate 110 is bent or in a bending state, the oxide semiconductor TFT 124 can be maintained at a stable on-state, thus allowing the photo sensing element 120 for normal operation. As such, the design of the current embodiment provides a solution regarding the problem that when flexible substrate 110 is bent, the photo sensing element 120 is incapable of normal operation.

It should be noted that when the photo sensing element 120 senses a light, the photo sensing TFT 122 is in an off-state. In fact, the sensing operation of the photo sensing element 120 is executed by inputting a certain inverse voltage from the gate of the photo sensing TFT 122. In such a way, the photo sensing element 120 is operated with a leakage current under the off-state of the photo sensing TFT 122. As such, regardless of the semiconductor material selected for making the semiconductor channel layer of the photo sensing TFT 122, the photo sensing TFT 120 is adapted for correctly sensing the light and remains unaffected even when the flexible substrate 110 is bent.

Figure 3:
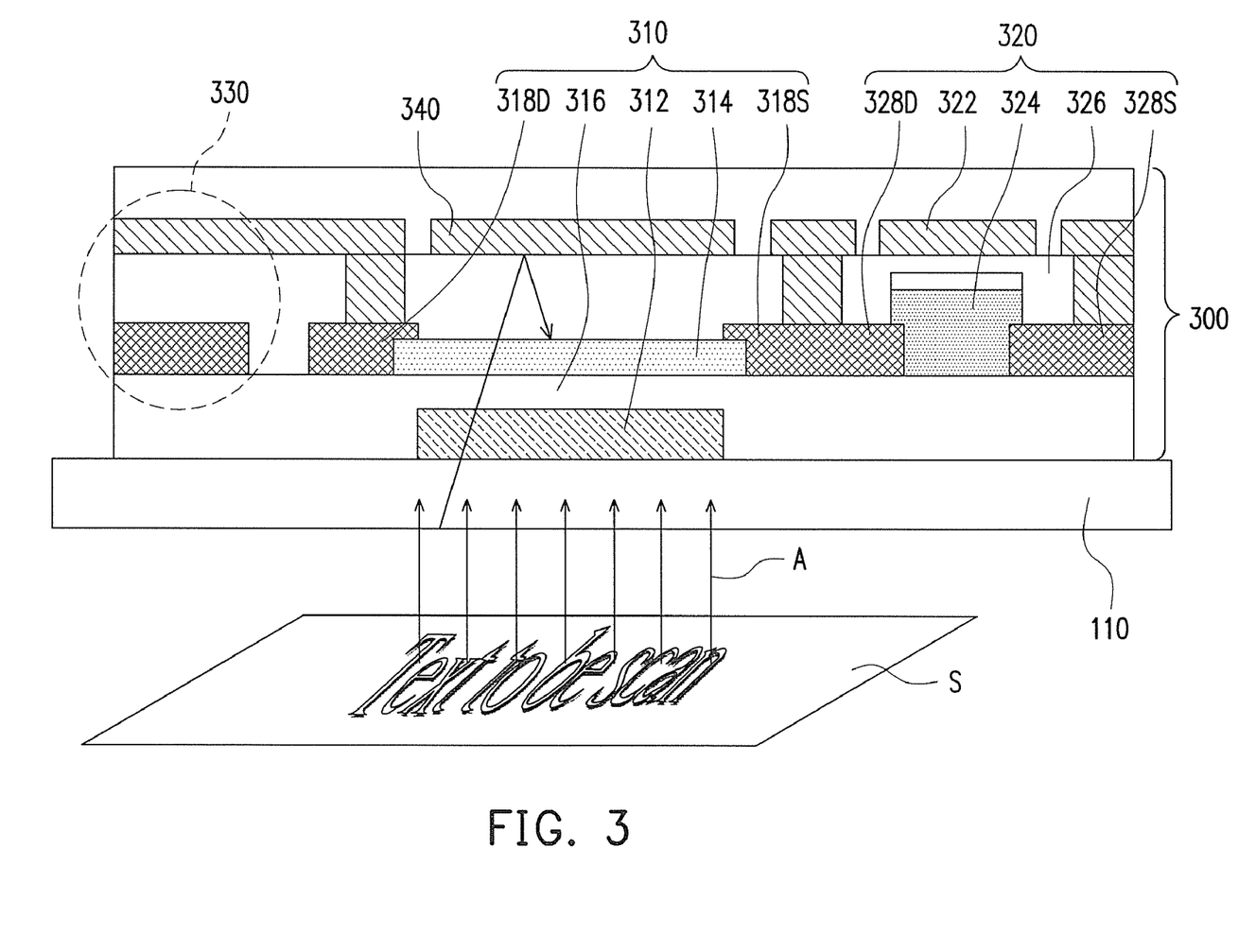
FIG. 3 is a structural cross-sectional view of a photo sensing element according to a first embodiment of the disclosure.

Moreover, in the photo sensing element 120, the two TFTs 122 and 124 can be designed with different structures. Several structure designs are to be further discussed herebelow for illustrating the spirit of the disclosure without restricting the scope of the disclosure. First, FIG. 3 is a structural cross-sectional view of a photo sensing element according to a first embodiment of the disclosure. Referring to FIG. 3, a photo sensing element 300 is disposed on the flexible substrate 110. The photo sensing element 300 includes a photo sensing TFT 310, an oxide semiconductor TFT 320, and a capacitor 330.

Specifically, the photo sensing TFT 310 includes a transparent gate 312, a photo sensitive semiconductor layer 314, a dielectric layer 316, a source 318S, and a drain 318D. The dielectric layer 316 is disposed between the gate 312 and the photo sensitive semiconductor layer 314. The source 318S is coupled to the photo sensitive semiconductor layer 314, and the drain 318D is also coupled to the photo sensitive semiconductor layer 314. The source 318S and the drain 318D are positioned at two opposite sides of the gate 312. In the current embodiment, the gate 312 is made of a transparent conductive material, such as indium tin oxide (ITO), indium zinc oxide (IZO), or silver.

Further, the oxide semiconductor TFT 320 includes a gate 322, an oxide semiconductor layer 324, a dielectric layer 326, a source 328S, and a drain 328D. The dielectric layer 326 is disposed between the gate 322 and the oxide semiconductor layer 324. The source 328S is coupled to the oxide semiconductor layer 324, and the drain 328D is also coupled to the oxide semiconductor layer 324. The source 328S and the drain 328D are positioned at two opposite sides of the gate 322.

In the current embodiment, the photo sensing TFT 310 for example is a bottom gate type TFT, and the oxide semiconductor TFT 320 for example is a top gate type TFT. However, it should be noted that the disclosure is not restricted to be such. In other embodiments, the photo sensing TFT 310 and the oxide semiconductor TFT 320 can be designed as both of them are bottom gate type, or both of them are top gate type, or one is top gate type and the other one is bottom gate type. The structural design of the TFTs may be varied in accordance with requirements of practical processing conditions. Further, in the current embodiment, the dielectric layer 316 and the dielectric layer 326 are different layers. However, in other embodiments, the structural design of the dielectric layers might be modified to be a single layer in accordance with the variation of the structural design of the TFTs 310 and 320. The structure shown in FIG. 3 is exemplified for illustrating the spirit of the disclosure without restricting the scope of the disclosure.

Further, it should be clarified that the photo sensing element 300 is disposed on the flexible substrate 110. As such, in order to allow the photo sensing element 300 to sense light in different states, in the current embodiment, the oxide semiconductor TFT 320 is employed as a switching element for controlling the photo sensing element 300 to be turned on or off. In such a way, when the flexible substrate 110 is bent, the photo sensing element 300 can still work normally.

The oxide semiconductor layer 324 of oxide semiconductor TFT 320 is made of an oxide semiconductor material. For example, the oxide semiconductor material can be zinc oxide (ZnO), indium gallium zinc oxide (InGaZnO), or indium zinc tin oxide (InZnSnO). Except the semiconductor features, the oxide semiconductor materials can also provide certain stability when the flexible substrate 110 is bent. In other words, these oxide semiconductor materials are relatively insensitive with respect to the bending of the flexible substrate 110, in that even when the flexible substrate 110 is bent, the oxide semiconductor material remain original semiconductor features as unaffected. As such, when the photo sensing element 300 is disposed on the flexible substrate 110, it achieves a high reliability. Therefore, it can be widely applied in different flexible electronic products, such as a flexible scanner, a flexible file copier, robot-used artificial skin, or an artificial retina.

Further, the photo sensing TFT 310 is adapted for sensing light. As such, the photo sensitive semiconductor 314 is made of a photo sensitive semiconductor material, such as amorphous silicon material or organic semiconductor material. The organic semiconductor material can be a hybrid film of poly(3-hexylthiophene) and phenyl-$C_{61}$-butyric acid methyl ester (P3HT:PCBM), a hybrid film of copper phthalocyanine and carbon-60 (CuPC:C60), or a hybrid film of zinc phthalocyanine and carbon-60 (ZnPC:C60). In the current embodiment, the gate 312 of the photo sensing TFT 310 for example is made of a transparent conductive material. Meanwhile, the flexible substrate 110 for example can be made of a transparent material such as polyimide, polyethylene naphthalate (PEN), or polyethylene terephthalate (PET). In other words, the photo sensing element 300 is adapted for sensing a light transmitting from one side adjacent to the flexible substrate toward the photo sensing element 300, i.e., as directed by the arrows A. That is, the photo sensing element 300 is adapted for sensing a light reflected from a sample S as shown in FIG. 3.

In accordance with the design of the photo sensing element 300 in the current embodiment, a reflective pattern layer 340 can be further disposed on the flexible substrate 110. Specifically, the gate 312 and the photo sensitive semiconductor layer 314 for example are sandwiched between the flexible substrate 110 and the reflective pattern layer 340. When an external light incident in the photo sensing element 300 along the direction indicated by the arrows A, the external light will be reflected by the reflective pattern layer 340 to re-illuminate the photo sensitive semiconductor layer 314, so that the photo sensitive element 300 can achieve a more apparent sensing signal, and become more sensitive for sensing light.

Figure 4:
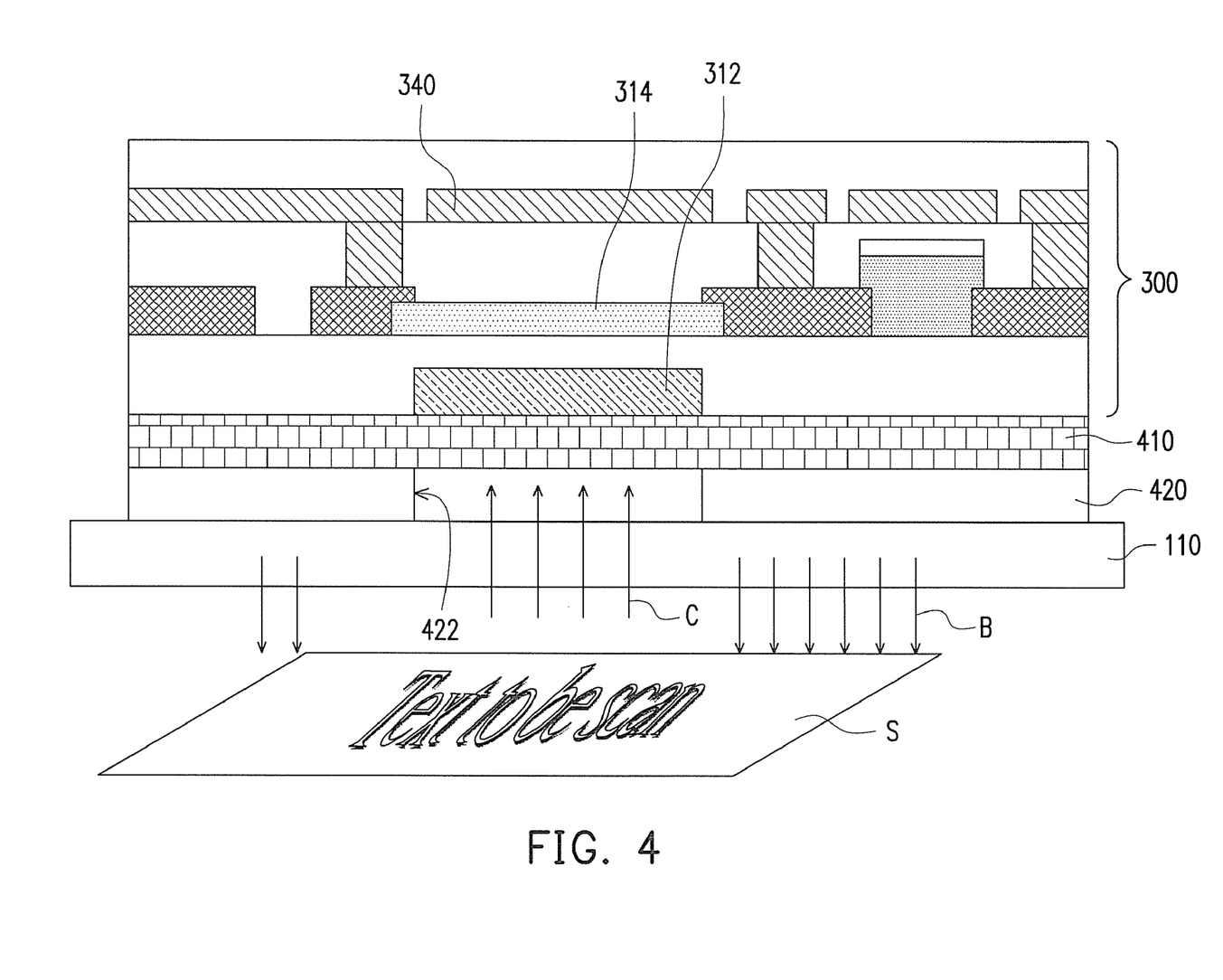
FIG. 4 is another structural cross-sectional view illustrating the photo sensing elements of the first embodiment being employed in the photo sensing element array substrate as shown in FIG. 1.

FIG. 4 is another structural cross-sectional view illustrating the photo sensing elements of the first embodiment being employed in the photo sensing element array substrate as shown in FIG. 1. Referring to FIG. 4, the photo sensing element 300 is disposed on the flexible substrate 110. The photo sensing element 300 shown in FIG. 4 is similar to that shown in FIG. 3, and is not to be iterated hereby. FIG. 4 differs from FIG. 3 in that a color filter layer 410 is further provided on the flexible substrate 110 of FIG. 4, while the gate 312 and the photo sensitive semiconductor layer 314 are sandwiched between the color filter layer 410 and the reflective pattern layer 340. Because of the employment of the color filter layer 410, when sensing light, the photo sensing element 300 is capable of sensing color lights of different wavelengths. Therefore, the photo sensing element array substrate 100 can be used for sensing a colourful image, copying colourful files, sensing colourful samples. In other words, according to the configuration of the design shown in FIG. 4, the photo sensing element array substrate 100 can be used for sensing the multicolour sample S, and further extending the application area of the photo sensing element array substrate 100.

In practice, in order to maintain the light after passing through the color filter layer 410 at a certain intensity so as to improve the sensing sensitivity of the photo sensing element 300, a light emitting source 420 can be further provided on the flexible substrate 110. The light emitting source 420 can be disposed between the color filter layer 410 and the flexible substrate 110. Further, the light emitting source 420 for example is configured with an opening 422 for correspondingly exposing an area where the gate 312 is located. The light emitting source 420 for example provides a white light. After incident along the direction indicated by arrows B onto the sample S, the light provided by the light emitting source 420 is reflected by the sample S and transmitted along the direction indicated by arrows C into the photo sensing element 300 via the opening 422 and the color filter layer 410. In other words, in the current embodiment, the sample S being sensed is a light-reflective sample S. Because the color filter layer 410 filters light passing therethrough, only a part of the light can be received by the photo sensing element 300. As such, the employment of the light emitting source 420 is helpful for improving the intensity of the light entering the photo sensing element 300, so as to further improve the sensitivity of the photo sensing element 300.

It should be noted that, in other embodiment of the disclosure, the flexible substrate 110 might be not provided with the color filter layer 410. In this case, in order to sense a colourful sample S, the light emitting source 420 can be adapted to provide a red light, a green light, or a blue light. Or otherwise, the light emitting source 420 sequentially emits lights of different colors. When the light emitting source 420 emits a red light, only a part of the sample S which is red can be sensed by the photo sensing element 300. Similarly, when the light emitting source 420 emits a blue light or a green light, only a part of the sample S which is blue or green can be sensed. In such a way, the multicolour sensing performance can also be achieved.

Further, the disclosure is not restricted to be exactly as discussed above. If the photo sensitive semiconductor layer 314 is made of organic semiconductor material, the organic semiconductor can be specifically selected so that the photo sensing element 300 can selectively sense lights of different colors. For example, a hybrid film of poly(3-hexylthiophene) and phenyl-$C_{61}$-butyric acid methyl ester (P3HT:PCBM) is inclined to absorb the light having the wavelength around 500 nm. A hybrid film of copper phthalocyanine and carbon-60

(CuPC:C60) is inclined to absorb the light having the wavelength around 600 nm. A hybrid film of zinc phthalocyanine and carbon-60 (ZnPC:C60) is inclined to absorb the light having the wavelength around 700 nm. In fact, different kinds of organic semiconductor materials represent different responses to lights of different wavelengths. In other words, different kinds of organic semiconductor materials can be used for sensing lights of different colors. Therefore, in the photo sensing element array substrate 100 shown in FIG. 1, photo sensitive semiconductor layers 314 of different photo sensing elements 300 can be selectively made of different organic semiconductor materials. In such a way, the photo sensing element array substrate 100 can achieve a full-color sensing performance.

Figure 5:
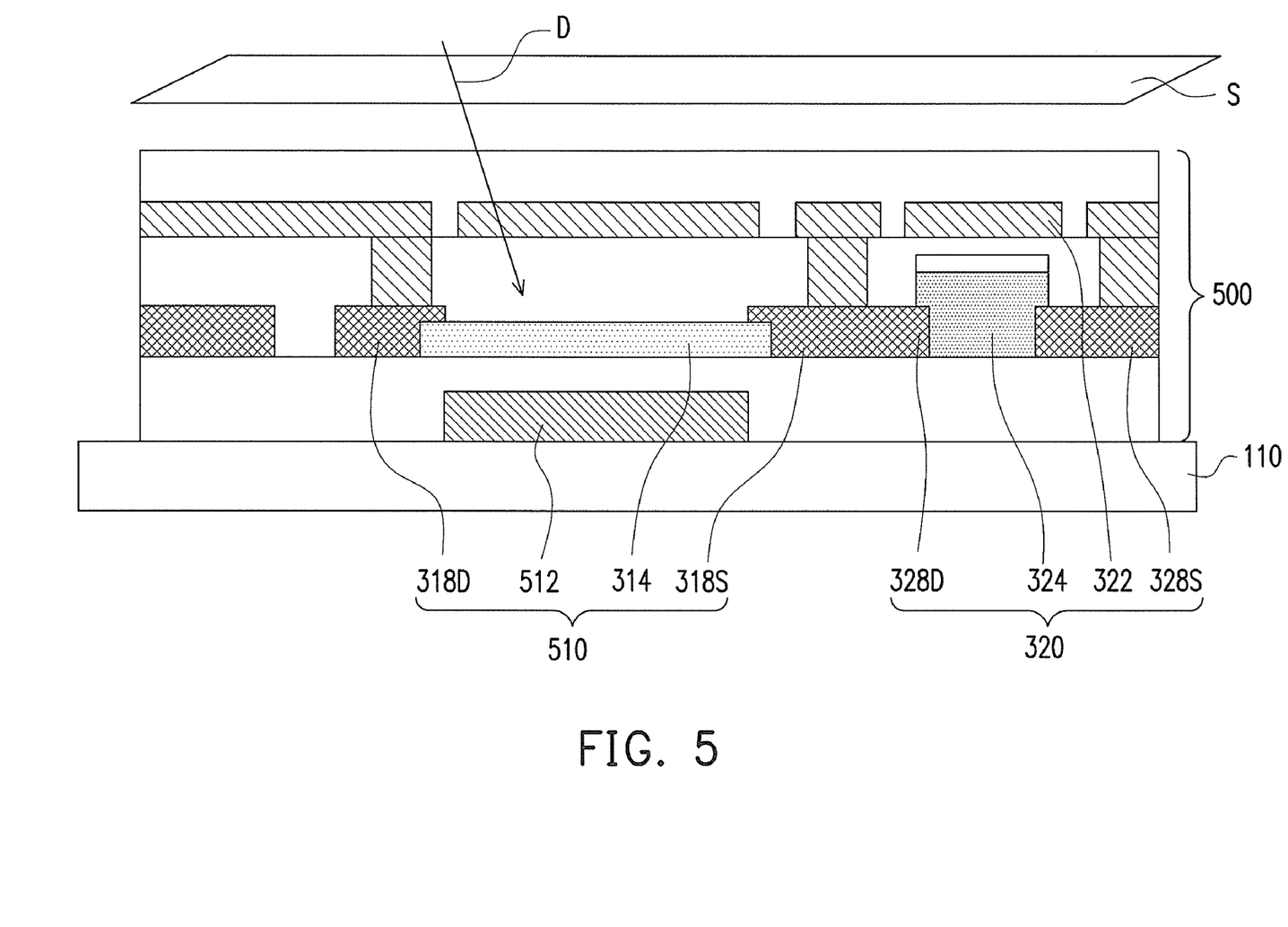
FIG. 5 is a structural cross-sectional view of a photo sensing element according to a second embodiment of the disclosure.

FIG. 5 is a structural cross-sectional view of a photo sensing element according to a second embodiment of the disclosure. Referring to FIG. 5, a photo sensing element 500 is disposed on the flexible substrate 110. As shown in FIG. 5, the photo sensing element 500 is structurally similar with the photo sensing element 300, except that a gate 512 of a photo sensing TFT 510 shown in FIG. 5 is made of a metal. In other words, the gate 512 is non-transparent. Further, in the current embodiment, the flexible substrate can be made of polyimide, PEN, PET, or a metal foil.

In the current embodiment, the gate 512 is non-transparent, and therefore the photo sensing element 500 is capable of sensing the light incident from a side of the photo sensing element 500 which is apart from the flexible substrate 110 only. In other words, the light incident from another side of the photo sensing element 500 which is adjacent to the flexible substrate 110 will be sheltered by the gate 512, and cannot be transmitted into the photo sensing element 500. As such, the flexible substrate 110 is not restricted to be transparent in the current embodiment. It can also be made of a non-transparent material, e.g., a metal foil. In this case, the sample S for example is a transparent or a semitransparent file, so that the light can be sensed by the photo sensing element 500 after passing through the sample S along the direction indicated by arrows D.

In the current embodiment, the photo sensing element 500 includes two TFTs 510 and 320. The TFTs 510 and 320 can be designed as one is a top gate type and the other one is a bottom gate type, or both of them are top gate type, or both of them are bottom gate type. Further, in order to achieve a full-color photo sensing performance, the photo sensing element 500 can be further provided with a color filter layer (not shown) at the side of the photo sensing element 500 which is apart from the flexible substrate 110. In this case, before being transmitted into the photo sensing element 500 along the direction indicated by the arrows D, the light passes through the color filter layer (not shown), and is filtered thereby. In such a way, the full-color sensing performance can be achieved.

In summary, the disclosure employs an oxide semiconductor TFT as a switching unit. As such, when photo sensing elements of the disclosure are disposed on the flexible substrate, they can be maintained with rather stable functions. In other words, even when the photo sensing element array substrate of the disclosure is bent, it can still be maintained for normal operation. Further, in the photo sensing element array substrate of the disclosure, the photo sensing element can be facilitated by the color filter layer or the light emitting source for achieving the full-color sensing function. As such, the photo sensing element array substrate of the disclosure can be widely applied in different flexible electronic products.

the photo sensing element array substrate is bent, the oxide semiconductor TFT in an on-state is capable of maintaining a normal operation mode. Therefore, the photo sensing element array substrate is applicable for many kinds of flexible electronic products without bringing the problem of causing incapability of normal operation when the electronic product is bent.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A photo sensing element array substrate, at least comprising:
    a flexible substrate; and
    a plurality of photo sensing elements, disposed in array on the flexible substrate, each of the photo sensing elements at least comprising:
        a photo sensing thin film transistor (TFT), disposed on the flexible substrate;
        an oxide semiconductor TFT, disposed on the flexible substrate, and electrically connected to the photo sensing TFT, wherein one of the photo sensing TFT and the oxide semiconductor TFT is a top gate type TFT and the other of the photo sensing TFT and the oxide semiconductor TFT is a bottom gate type TFT; and
        a capacitor, disposed on the flexible substrate and electrically connected between the photo sensing TFT and the oxide semiconductor TFT.

2. The photo sensing element array substrate according to claim 1, wherein the oxide semiconductor TFT at least comprises:
    a gate;
    an oxide semiconductor layer;
    a dielectric layer, disposed between the gate and the oxide semiconductor layer;
    a source, coupled to the oxide semiconductor layer; and
    a drain, coupled to the oxide semiconductor layer, wherein the source and the drain are positioned at two opposite sides of the gate.

3. The photo sensing element array substrate according to claim 2, wherein the oxide semiconductor layer at least comprises zinc oxide (ZnO), indium gallium zinc oxide (InGaZnO), or indium zinc tin oxide (InZnSnO).

4. The photo sensing element array substrate according to claim 1, wherein the photo sensing TFT at least comprises:
    a gate;
    a photo sensitive semiconductor layer;
    a dielectric layer, disposed between the gate and the photo sensitive semiconductor layer;
    a source, coupled to the photo sensitive semiconductor layer; and
    a drain, coupled to the photo sensitive semiconductor layer, wherein the source and the drain are positioned at two opposite sides of the gate.

5. The photo sensing element array substrate according to claim 4, wherein the photo sensitive semiconductor layer at least comprises an amorphous silicon material.

6. The photo sensing element array substrate according to claim 4, wherein the photo sensitive semiconductor layer at least comprises an organic semiconductor material.

7. The photo sensing element array substrate according to claim 6, wherein the photo sensitive semiconductor layer at least comprises a hybrid film of poly(3-hexylthiophene) and phenyl-C61-butyric acid methyl ester (P3HT:PCBM), a hybrid film of copper phthalocyanine and carbon-60 (CuPC:C60), or a hybrid film of zinc phthalocyanine and carbon-60 (ZnPC:C60).

8. The photo sensing element array substrate according to claim 4, wherein the gate at least comprises a metal.

9. The photo sensing element array substrate according to claim 8, wherein the flexible substrate at least comprises polyimide, polyethylene naphthalate (PEN), polyethylene terephthalate (PET), or a metal foil.

10. The photo sensing element array substrate according to claim 4, wherein the gate at least comprises a transparent conductive material.

11. The photo sensing element array substrate according to claim 10, wherein the transparent conductive material is indium tin oxide (ITO), indium zinc oxide (IZO), or silver.

12. The photo sensing element array substrate according to claim 10, wherein the flexible substrate at least comprises polyimide, polyethylene naphthalate (PEN), or polyethylene terephthalate (PET).

13. The photo sensing element array substrate according to claim 10, further at least comprising a reflective pattern layer disposed on the flexible substrate, wherein the gate and the photo sensitive semiconductor layer are sandwiched between the flexible substrate and the reflective pattern layer.

14. The photo sensing element array substrate according to claim 13, further at least comprising a color filter layer disposed on the flexible substrate, wherein the gate and the photo sensitive semiconductor layer are sandwiched between the color filter layer and the reflective pattern layer.

15. The photo sensing element array substrate according to claim 14, further at least comprising a light emitting source disposed between the color filter layer and the flexible substrate, wherein the light emitting source is configured with an opening for exposing an area where the gate is located.

16. The photo sensing element array substrate according to claim 15, wherein the light emitting source is adapted for providing a white light, a red light, a green light, or a blue light.

17. The photo sensing element array substrate according to claim 10, wherein the photo sensing TFT is the bottom gate type TFT.

18. The photo sensing element array substrate according to claim 17, wherein the oxide semiconductor TFT is the top gate type TFT.

19. The photo sensing element array substrate according to claim 1, wherein the photo sensing TFT is the top gate type TFT.

20. The photo sensing element array substrate according to claim 19, wherein the oxide semiconductor TFT is the bottom gate type TFT.

21. A photo sensing element array substrate, at least comprising:
a flexible substrate; and
a plurality of photo sensing elements, disposed in array on the flexible substrate, each of the photo sensing elements at least comprising:
a photo sensing thin film transistor (TFT), at least comprising:
a first gate, disposed on the flexible substrate;
a first dielectric layer, disposed on the flexible substrate and covering the gate;
a photo sensitive semiconductor layer, disposed on the first dielectric layer and positioned above the gate;
a first source, coupled to the photo sensitive semiconductor layer; and
a first drain, coupled to the photo sensitive semiconductor layer, wherein the first source and the first drain are positioned at two opposite sides of the first gate;

an oxide semiconductor TFT, disposed on the flexible substrate, and electrically connected to the photo sensing TFT, the oxide semiconductor TFT:
an oxide semiconductor layer, disposed on the first dielectric layer;
a second source, coupled to the oxide semiconductor layer;
a second drain, coupled to the oxide semiconductor layer, wherein the second source and the second drain are positioned at two opposite sides of the oxide semiconductor layer;
a second dielectric layer, disposed on the flexible substrate and covering the oxide semiconductor layer; and
a second gate, disposed on the second dielectric layer and positioned above the oxide semiconductor layer; and
a capacitor, disposed on the flexible substrate and electrically connected between the photo sensing TFT and the oxide semiconductor TFT.

22. The photo sensing element array substrate according to claim 21, wherein the oxide semiconductor layer at least comprises zinc oxide (ZnO), indium gallium zinc oxide (InGaZnO), or indium zinc tin oxide (InZnSnO).

23. The photo sensing element array substrate according to claim 21, wherein the photo sensitive semiconductor layer at least comprises an amorphous silicon material.

24. The photo sensing element array substrate according to claim 21, wherein the photo sensitive semiconductor layer at least comprises an organic semiconductor material.

25. The photo sensing element array substrate according to claim 21, wherein the photo sensitive semiconductor layer at least comprises a hybrid film of poly(3-hexylthiophene) and phenyl-C61-butyric acid methyl ester (P3HT:PCBM), a hybrid film of copper phthalocyanine and carbon-60 (CuPC:C60), or a hybrid film of zinc phthalocyanine and carbon-60 (ZnPC:C60).

26. The photo sensing element array substrate according to claim 21, wherein the first gate at least comprises a transparent conductive material.

27. The photo sensing element array substrate according to claim 26, wherein the transparent conductive material is indium tin oxide (ITO), indium zinc oxide (IZO), or silver.

28. The photo sensing element array substrate according to claim 21, wherein the flexible substrate at least comprises polyimide, polyethylene naphthalate (PEN), or polyethylene terephthalate (PET).

29. The photo sensing element array substrate according to claim 21, further at least comprising a reflective pattern layer disposed on the flexible substrate, wherein the first gate and the photo sensitive semiconductor layer are sandwiched between the flexible substrate and the reflective pattern layer.

30. The photo sensing element array substrate according to claim 29, further at least comprising a color filter layer disposed on the flexible substrate, wherein the first gate and the photo sensitive semiconductor layer are sandwiched between the color filter layer and the reflective pattern layer.

31. The photo sensing element array substrate according to claim 30, further at least comprising a light emitting source disposed between the color filter layer and the flexible substrate, wherein the light emitting source is configured with an opening for exposing an area where the first gate is located.

32. The photo sensing element array substrate according to claim 31, wherein the light emitting source is adapted for providing a white light, a red light, a green light, or a blue light.

* * * * *